United States Patent [19]
Raser
[11] 3,831,169
[45] Aug. 20, 1974

[54] OPAQUE-VANE ANALOG TO DIGITAL CONVERTER

[76] Inventor: William H. Raser, 645 W. 83rd, Los Angeles, Calif. 90045

[22] Filed: May 15, 1972
[21] Appl. No.: 253,330

[52] U.S. Cl. .......... 340/347 P, 250/231 SE
[51] Int. Cl. .......... G08c 9/06
[58] Field of Search .... 340/347 P, 190; 235/92 GC; 250/219 DD, 231 SE, 236

[56] References Cited
UNITED STATES PATENTS

| | | | |
|---|---|---|---|
| 2,989,642 | 6/1961 | Svec | 250/236 X |
| 3,098,152 | 7/1963 | Von Mathes | 340/347 P X |
| 3,278,929 | 10/1966 | Susor | 340/347 P |
| 3,349,325 | 10/1967 | Bajars | 340/347 P X |
| 3,454,777 | 7/1969 | Marcus | 250/219 DD X |
| 3,513,461 | 5/1970 | Hawley | 340/347 P X |

Primary Examiner—Charles D. Miller
Attorney, Agent, or Firm—Joseph E. Keininger

[57] ABSTRACT

In an analog-to-digital converter involving photo-optical sensing of a relatively movable part having a semicircular vane, an optical scanning head traverses the extremity of both this vane and a fixed vane to generate a pulse, the duration of which determines the output of a counter. Because of the absence of intricate mechanical components such as coded disks, precise measurements can be obtained using inexpensive components that can be combined in a compact housing.

17 Claims, 10 Drawing Figures

OPAQUE-VANE ANALOG TO DIGITAL CONVERTER

CROSS REFERENCE TO RELATED U.S. PATENTS

U.S. Pat. Nos. 2,734,188, Jacobs, (Feb. 7, 1956); 2,930,033; Webb, (Mar. 22, 1960); 3,024,986; Strianese, et al. (Mar. 13, 1962); 3,205,489; O'Maley, (Sept. 7, 1965) 3,247,506; Grim, (Apr. 19, 1966).

BACKGROUND OF THE INVENTION

The present invention relates to the digital encoding of analog displacements and, particularly, to the determination of precise information regarding relative mechanical position. In order to illustrate the present invention, the following discussion will refer primarily to the determination of the angular position of one shaft. However, it will be understood that multichannel coaxial shaft encoding by which digital measurements are made of two or more shaft positions also is encompassed.

In previous shaft angle encoders, angular position is determined in conjunction with a code disk that is provided with a series of concentric tracks, each having alternative transparent and opaque areas or sectors. In such encoders, a lamp is disposed adjacent to one side of the code disc and light-responsive cells are disposed on the other side of the code disc, each confronting a coded track. Production of such encoders involves the difficulty of working with transparent material, the expense of producing accurate coding tracks on such material, and problems associated with positioning the multiplicity of lamps and photocells to minimize cross talk. As the resolution is improved, greater crowding makes it more difficult to collimate to avoid seepage of light around the edges of an opaque sector.

These mechanical and optical difficulties are eliminated if the disk is required to produce just one simple waveform. Recent large-scale integration of semiconductor circuits renders a process of counting pulses with inexpensive integrated circuits. If, from the disk, a single pulse is generated which has a pulsewidth proportional to the encoder shaft angle position and if an oscillator output is modulated using this single pulse, the number of pulses that result will also be proportional to the shaft angle.

PURPOSE OF THE INVENTION

It is the purpose of this invention to provide an optical analog to digital converter which has approximately the reliability, accuracy and convenience of the typical high-priced absolute-reading optical encoders but which also has the mechanical simplicity and low cost characteristic of the one-track optical encoders sometimes referred to as incremental encoders. An incremental encoder has just one or two of the tracks of an absolute encoder and relies on a continuously-counting up-down counter to calculate absolute position. The incremental encoder is often inconvenient to use in any system that is turned off frequently since such an encoder requires special provisions and procedures for introducing correct absolute digital reference values. Once the correct absolute count is entered into the counter, the incremental encoder provides only what information is needed to change the count, namely, the positive or negative increments as they occur. The up-down counter of the incremental encoder is obviously more complicated than the one-directional up counter used in the present invention.

It is a further object of the present invention to minimize mainly static errors. The accuracy of encoders can be discussed in terms of three different types of errors as follows:

1. Static error or error when the shaft is not turning. This tends to be the resolution of the digital output but can include significant optical errors due to scattering of light. Scattering is less when light is cut off by an opaque vane than when it is controlled by a change in reflectivity as is produced by the imposition of the pointer used by J. B. O'Maley in Pat. No. 3,205,489.
2. Ordinary velocity error. This is approximately proportional to the product of shaft velocity and photosensor time constant.
3. Asynchronous velocity error. This is approximately proportional to the product of shaft velocity and sampling execution time errors. For the conventional absolute optical encoder, this particular component of error is negligible. For the present invention, the worst-case sampling execution time error is one scanning cycle time. For minimum error, scanning speed must be high.

It is a further object of the present invention to minimize maintenance requirements. One example of this is locating the source of illumination on the surface of the encoder so that lamp replacement is a simple procedure. Also, this lamp location permits high scanning speed.

It is a further object of this invention to provide a configuration which is adaptable to the encoding of several independent coaxial shafts. U.S. Pat. No. 3,346,724 is an example of a situation where the introduction of a two-channel coaxial shaft encoder would lead to an improvement.

DESCRIPTION OF PREFERRED EMBODIMENTS

Figure 1:
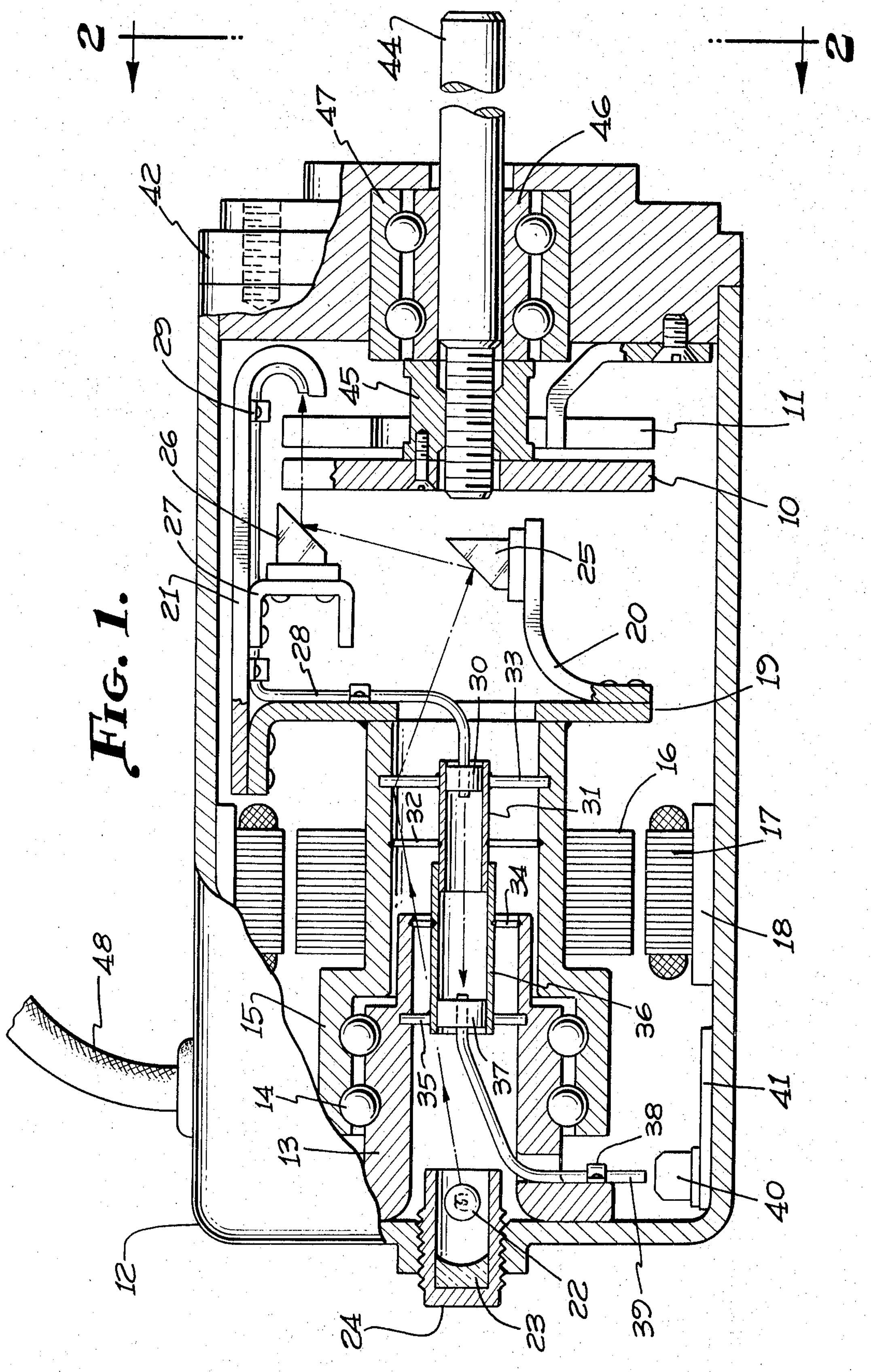
FIG. 1 is an elevational sectional view of the encoder transducing mechanism in a first embodiment of this invention.

As illustrated in FIG. 1, the analog to digital encoder has a rotatable sector-shaped vane, 10 and a fixed sector-shaped vane, 11 interposed between an illumination system and a light sensing system contained in a housing, 12. Usually, these sectors are semi-circles, and, like all sectors, contain arcs of circles. Part of both the illuminating and sensing systems are located inside of a cylindrical boss, 13 which is cantilevered inside the housing 12. Fitted around the boss, 13 with balls, 14 is a sleeve 15. This sleeve serves as the shaft of a constant-speed brushless motor, preferably a hysteresis-type synchronous motor. The rotor of this motor consists of ferrous laminations, 16 pressed onto the sleeve, 15. Likewise, a stator, 17 which includes windings is fitted inside the housing, 12 by means of a mounting member, 18. When power is supplied to this motor, the sleeve, 15 rotates and carries with it a bulkhead, 19 on which is mounted an arm 20 and a bar, 21.

The source of illumination for an optical determination of the position of vane, 10 is either a lamp or a light-emitting diode. FIG. 1 shows a lamp, 22 and an approximately parabolic mirror, 23 mounted inside a ferrule, 24. This ferrule is threaded for convenient attachment and removal from the housing, 12. The space inside the boss, 13 and sleeve 15 is mostly open and permits some of the light from the lamp, 22 and its reflector to reach two mirrors in succession. The first mirror, 25 is mounted on arm, 20 and the second, 26 is mounted on bar, 21 by means of a supporting bracket, 27. Enhancement and control of the light so directed is optionally improved by placing a reflecting surface on the inside of the sleeve, 15 and by adding collimating means which are not shown. A broken line in FIG. 1 shows the general direction of this directed light. It is directed to a small spot near a circular projection of the periphery of vanes 10 and 11. This spot revolves along the periphery of the circular projection of the vanes as a result of the revolution of the motor and of bulkhead, 19.

Also revolving with the motor is an optical fiber or bundle of fibers sometimes referred to as a light pipe, 28. By means of small clamps, 29, one end of these fibers is attached to the bar, 21 in a position aligned with the spot of light projected from the mirrors, 25 and 26. The other end fits into a plug, 30 which is inserted into an inner tube, 31. By means of pins, 32 and spokes, 33, this tube, 31 is held concentric to sleeve, 15. By means of additional pins 34 and spokes, 35, an outer tube, 36 is held in a fixed axial position inside boss, 13 and in a concentric and telescoped position with respect to the inner tube, 31. By means of a second plug, 37, and additional clamps, 38, a second light pipe or optical fibers, 39 is aligned with the first optical fibers and leads to a photocell, 40, on a fixed photocell mount, 41. Therefore, light can pass from lamp, 22 to photocell 40 only when neither vane, 10 nor vane, 11 is interposed between mirror, 26 and the receiving end of optical fibers, 28.

A faceplate, 42 is attached to housing, 12 and provides a support for the fixed vane, 11. A shaft, 44 is fitted with a nut, 45 to which the moveable vane, 10 is attached. An inner race, 46 and an outer race, 47 provide a ball bearing support for the shaft, 44 inside the faceplate, 42.

Vanes 10 and 11 are parallel and close to each other. If the angle of shaft, 44 is such that these vanes, which are semicircular in plan view, are positioned to have no overlapping at their periphery, they will appear to form a complete opaque circle in plan view. This is considered to be the zero position angle of the shaft, 44. The maximum shaft position is 180° from this position. Optionally, mechanical stops, which are not shown, may be provided to limit shaft rotation to this 180° range. If a once-per-revolution timing signal were generated at the motor and used to sense which of two types of timing patterns were being generated, the range could be doubled and would become 360° of shaft angle.

Figures 3, 4, 5A, 5B, 6:
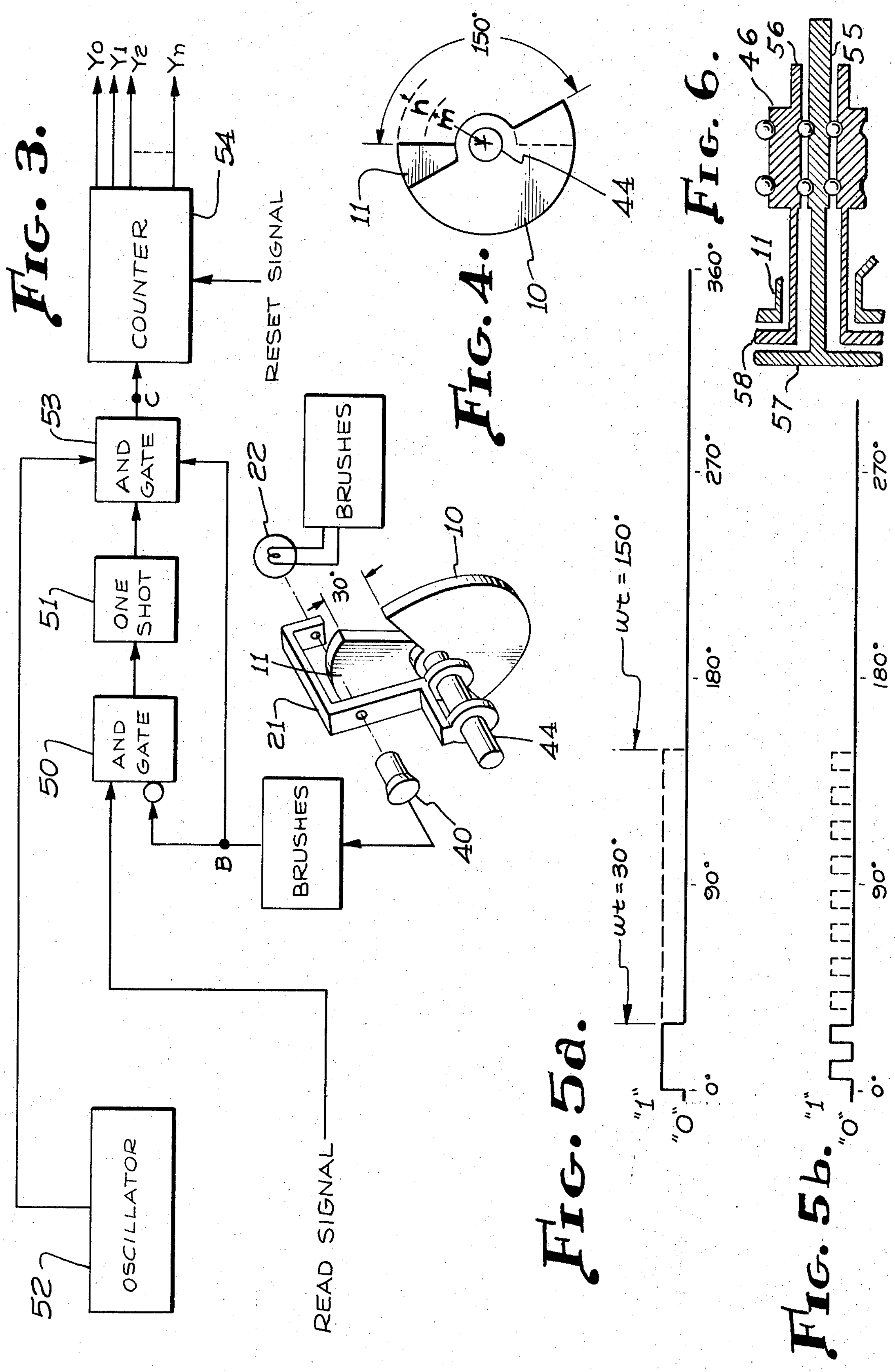
FIG. 3 is a perspective view of the moving and fixed vanes and other principal elements in a second embodiment of this invention. In this embodiment, an illumination source and a photocell are permitted to rotate with the scanning head. In this embodiment, brushes are necessary to convert the photocell signals to fixed structure. The encoder shaft is shown at an angle which is 30° toward midrange from its minimum-angle position. This figure also shows a block diagram of the electronics needed to complete the analog to digital conversion.
FIG. 4 is a plan view of the two vanes of FIG. 3 for the case where the shaft is 30° down (e.g., toward midrange) from its maximum-angle position.
FIG. 5*a* is a timing diagram of photocell output over one scan cycle where the solid line represents the output corresponding to the input shaft position depicted in FIG. 3 and where the broken line represents the output corresponding to the input shaft position depicted in FIG. 4.
FIG. 5*b* is the same as FIG. 5*a* except that the signals have had modulation added and are ready to be fed into the counter.
FIG. 6 is an elevational sectional view of an alternate form of the input mechanism of FIG. 1 in which two co-axial shafts, each with an opaque vane, take the place of one shaft and one vane.

In cases where reliability, maintenance and long life are of lesser importance, a simpler configuration is possible. FIG. 3 shows the main features of a second embodiment of this invention wherein the mirrors and optical fibers in FIG. 1 are replaced with brushes to provide electrical connections to rotating components. In other words, the lamp, 22 and the photocell 40 are mounted on the rotating bar, 21 so that scanning for the opening in the projected disk is done more directly. Each time the bar, 21 passes its uppermost position in a clockwise direction and continues for one revolution, light is permitted to penetrate the vane area for 30° and the photocell output waveform is approximately as shown by the solid line of FIG. 5*a*. This vane position represents 30° (say) from its zero angle. An additional 120° of clockwise rotation would produce the opening shown in FIG. 4 and a photocell output waveform shown by broken lines in FIG. 5*a*.

The waveforms of FIG. 5*a* can be read at point B in FIG. 3. The same results can be read at the output of photocell, 40 in FIG. 1, since, in FIG. 1, this photocell is stationary. Hence, the wave from the photocell 40 is the encoder output wire, B in FIG. 3 and is one of the lead wires in a cable, 48. Other wires in this cable are a ground wire, a lamp or LED supply wire, and usually three wires for three-phase motor power, usually 400 cps.

For either of the two embodiments just considered, the remainder of the analog to digital conversion process is accomplished using well-known electronic circuits. These circuits are represented in FIG. 3 using positive logic. These logic levels are defined in FIG. 5*a*. When a system supplies a read signal pulse which is accepted as a momentary logic level 1 at any time when B is 0, an and gate, 50 is switched on. A monostable multivibrator, 51 is activated and has a pulsewidth of one revolution of the bar, 21. A fixed-frequency square-wave oscillator, 52 feeds a summing gate, 53 which is now enabled to modulate the signal at B. The waveform of this summing gate is signal, C and is represented in FIG. 5*b* for the 30° (solid line) and for 150° (broken line) shaft angle positions. The 150° position is the position shown in FIG. 4. For simplicity, FIG. 5*b* depicts a very low oscillator frequency. In practice, a frequency is selected which produces many more pulses in FIG. 5*b* per degree of opening between the two vanes than is shown. The number of pulses for maximum input angle could be the maximum count available in a digital counter, 54 into which signal C is fed. A counter Reset Signal is required to clear the counter at the beginning of each conversion but this signal can be the same as the Read Signal in FIG. 3.

Figures 2, 7, 8, 9:
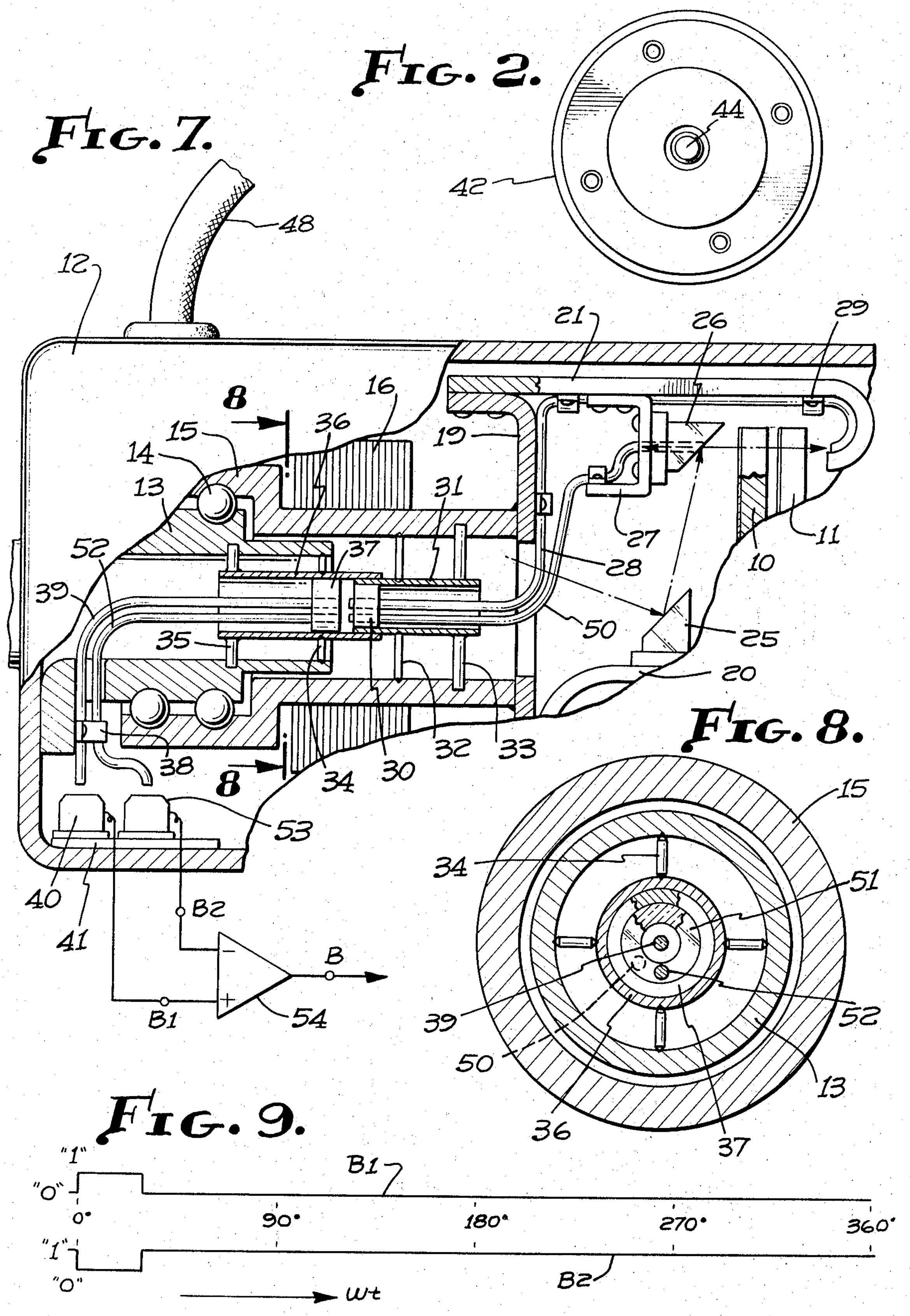
FIG. 2 is a plan view of the encoder transducing mechanism of FIG. 1.
FIG. 7 is a fragmentary view of an alternative form of some of the optical transmission and sensing means in FIG. 1. This alternative together with the use of a reflecting surface on one side of the moveable vane establishes a third embodiment of this invention.
FIG. 8 is an enlarged sectional view of FIG. 7.
FIG. 9 is a waveform diagram of the output from FIG. 7.

A third embodiment of this invention has few changes from the first embodiment and these changes are shown in FIG. 7. As before, the vanes are not transparent. However, in this embodiment, the sides of both vanes facing mirror, 26 are highly reflecting surfaces. Therefore, any time that light is blocked from entering fiber, 28, some light is reflected back into a hole in mirror, 26, through which is inserted an alternate optical fiber bundle, 50. This alternate fiber is inserted into an eccentric hole in the plug, 30 which is shown in FIG. 7 in a slightly different position from that of FIG. 1. Also, the position of the second plug, 37 is slightly changed.

In this third embodiment, the second plug, 37 contains an annular section, 51 made of lucite or other transparent material capable of gathering some of the light coming to it from the bundle of fibers, 50. To do this, the inside and outside radii of the lucite section must equal the minimum and maximum fiber distance within the bundle, 50 measured from the axis of the first plug, 30, respectively. This is indicated by the presence of a small dotted circle shown on the annular section, 51 in FIG. 8, which represents a possible position of the cross-section of the alternate bundle, 50 in this view. A second alternate fiber optic bundle, 52 is connected to this annular section, 51 and gathers some light from it. This second bundle, 52 feeds light into a second photocell, 53. With suitable amplification, a differential amplifier, 54 compares the outputs, B1 and B2 from photocells 40 and 53, respectively. FIG. 9 depicts the waveforms of signals B1 and B2 for the 30° angle position shown in FIG. 3.

The advantage of the third embodiment has to do with the fact that contrary to the ideal response depicted in FIGS. 5 and 9, none of the waveforms have zero rise time and zero fall time. For these times to be zero, all spots of light must have zero diameter. For finite waveform slope, anything which causes the illumination source intensity, mirror reflectively, fiberoptic transmissibility, or photocell gain to drift will introduce some error. The third embodiment of this invention eliminates most of these drift errors.

Any of these embodiments may be extended to accommodate two or more shaft inputs. If two coaxial shafts, 55 and 56 are used as shown in FIG. 6, a minimum of three opaque vanes are needed, one on each shaft and one fixed vane, 11. In other words, in place of one movable vane, 10, there is a vane, 57 on shaft, 55 and a vane, 58 on shaft 56. Instead of one light source, 22 and one sensor, 40 on the revolving bar, 21, this coaxial alternative requires two such sensor-source combinations, one revolving at a different radius from the other. For example, one sensor-source combination could be located within the radius, *m* shown in FIG. 4 and the other could operate within annulus, *n* of that figure; to confront the first such combination, vane, 57 would have a radius equal to *m* and to confront the second such combination, vane 58 could be transparent within a radius of *m* and by opaque within the *n* region. Although this two-channel alternative requires some duplication at the rotational interfaces and some additional circuitry, it is significant that no duplication is required of the motor, the oscillator, much of the revolving structure, part of the illumination means, etc.

In Pat. No. 3,043,962, E. M. Jones cites some error approximations for typical optical encoders. He considers a 13-bit shaft encoder revolving at six revolutions per minute with a 0.3 millisecond photocell time constant. Assuming static error is due equally to optical scatter and bit resolution, typical errors would be as follows:

Static error = 0° 26′

Ordinary velocity error = 0° 6.5′

Asynchronous velocity error = negligible

Since the frequency of an oscillator can be almost any value desired and since adding stages to the counter in the proposed invention, unlike adding finer coding tracks on the disk of a typical optical encoder, has no adverse optical effect, the limiting factor with regard to static error would be the scattering of light. If the geometry of the embodiment shown in FIG. 1 is compared with typical coded disk geometry, two overriding advantages of the present invention with regard to static error become clear:

1. Using present machinery practice, two layers of thin metal plate can occupy a thinner space than one layer of glass or other transparent material forming reliable structure.
2. Use of one light source and one photocell offers more opportunity for optimization and adjustment than does the crowding of many of these into a confined space with its interference effects.

The worst-case asynchronous error in the present invention would involve a delay of 1.5 motor revolutions. For a two-pole synchronous motor using 400 cps power, this would be 3.75 milliseconds or 12.5 times as much as the photocell time constant. If the two velocity errors considered are added and if some estimate is made for typical optical encoder asynchronous error at the shaft velocity considered, the velocity error of the present invention might be 10 times that of the typical optical encoder. On the other hand, when the shaft velocity approaches zero, the accuracy of the present invention can easily be 10 times as good as that of a typical coded disk encoder built with the same level of skill and workmanship. In any such comparison, however, cost is important; the present invention with its fewer, simpler and more conventional (metallic) precision parts represents a significant improvement.

Let the transition region between rotating and nonrotating structures be referred to as a rotational interface. Much of the structure which has been described relates to one of three structural groups as follows:

I. A rotating platform for a light source or a photosensitive device plus brushes to convey electricity across a rotational interface.

II. A fiberoptic channel across a rotational interface.

III. A system of mirrors to create an optical channel across a rotational interface.

If various forms of this invention are classified by listing first the light source structural grouping in terms of its above Roman numeral and, second, its photosensor structural grouping by these numerals, the form in FIG. 1 is clearly a III-II classification. Likewise, FIG. 2 is a I—I configuration. Other configurations which are embodiments of this invention can be classified as I-II, I-III, II-I, II-II, II-III, III-I and III-III.

In this discussion, the words "photocell" and "photosensor" have been applied interchangeably. As used, the word "photosensor" means any type of device which converts light intensity into any type of electrical signal. A sector-shaped vane is a thin opaque vane with an area shaped like a sector of a circle. A power source is a source of electrical power located on the non-rotating side of a rotational interface. Revolving platforms are called rotating platforms because they are mounted on rotating structure.

The invention claimed is:

1. An electro-optical absolute non-incremental type encoder comprising:

a housing having an axis, said housing supporting a rotatable protruding shaft on this axis;

a first entirely opaque sector-shaped vane fixed inside said housing;

a second opaque sector-shaped vane fixed to the shaft protruding from said housing, said two vanes being parallel, confronting and in close proximity to each other;

a first scanning platform confronting said second vane near its arc and a second scanning platform confronting said first vane near its arc, a line between two said platforms being in a plane which contains the axis of said housing and being subject to interference with zero, one, or two said vanes depending on the scanning position of said platforms relative to said vanes;

means for revolving said platforms together around the axis of said housing at substantially constant speed;

a light source;

a first means of energy transfer across a rotational interface in cooperation with said light source so that electrical power can produce a beam of light between the said two platforms;

an electrical photosensor;

a second means of energy transfer across a rotational interface in cooperation with said photosensor so that light coming toward the said second platform from the direction of said first platform causes an electrical output signal to be produced; and circuit means for processing the signals from said second means of energy transfer to provide a digital count which indicates the angular position of the shaft protruding from said housing.

2. Apparatus as set forth in claim 1 wherein said first and second means of energy transfer are electrical brushes which permit non-rotating electrical circuits to communicate with said light source and said electrical photosensor, respectively, said light source and said electrical photosensor being mounted on said first and second platforms, respectively.

3. Apparatus as set forth in claim 1 including a system of rotating and non-rotating mirrors serving as said first and second means of energy transfer.

4. Apparatus as set forth in claim 1 including lengths of optical fibers, some fixed inside said housing and some rotating about the axis of said housing, each of said means of energy transfer being an optical transmission means consisting of a first bundle of said optical fibers which are fixed and a second bundle of said optical fibers which are rotating, the two bundles communicating with each other by virtue of end alignment.

5. Apparatus as set forth in claim 1 including:

a first and a second mirror communicating with said light source and rotating about the axis of said housing, said first mirror being located at the axis of said housing and said second mirror being located on said first platform, said mirrors cooperating as the said first means of energy transfer; and a first and a second length of optical fiber communicating with said photosensor, said fiber lengths having one end located on the axis of said housing, said first length of optical fiber being fixed and having its other end confronting said photosensor, said second length of optical fiber rotating about the axis of said housing and having its other end mounted on said second platform, communication between said lengths of fibers being possible because of end alignment and proximity, said fibers cooperating as the said second means of energy transfer.

6. Apparatus as set forth in claim 1 including:

a first and a second mirror communicating with said photosensor and rotating about the axis of said housing, said first mirror being located at the axis of said housing and said second platform, said mirrors cooperating as the said second means of energy transfer; and a first and a second length of optical fibers communicating with said light source, said fiber lengths having one end located on the axis of said housing, said first length of optical fiber being fixed and having its other end confronting said light source, said second length of optical fiber rotating about the axis of said housing and having its other end mounted on said first platform, communication between said lengths of fibers being possible because of end alignment and proximity, said fibers cooperating as the said first means of energy transfer.

7. Apparatus as set forth in claim 1 including:

brushes mounted inside said housing and cooperating with said light source, said source being mounted on said first platform, said brushes and said light source cooperating as the said first means of energy transfer; and two lengths of fiberoptic material, one rotating and one stationary, the two lengths communicating by virtue of end alignment and proximity, the non-rotating length confronting the photosensor and the rotating length having one end mounted on said second platform, said lengths cooperating as the said second means of energy transfer.

8. Apparatus as set forth in claim 1 including:

brushes mounted inside said housing and cooperating with said photosensor, said photosensor being mounted on said second platform, said photosensor and said brushes cooperating as the said second means of energy transfer; and two lengths of fiberoptic material, one rotating and one stationary, the two lengths communicating by virtue of end alignment and proximity, the rotating length having one end mounted on first said platform and the non-rotating length having one end confronting said light source, said lengths cooperating as the said first means of energy transfer.

9. Apparatus as set forth in claim 1, including:

brushes mounted inside said housing as a part of one of said means of energy transfer; and two mirrors mounted for rotation about the axis of said housing as a part of the other of said means of energy transfer.

10. Apparatus as set forth in claim 1 including:

a reflecting surface on one side of each of said vanes;

a first length and a second length of fiberoptic material, the first rotating and the second stationary, said two lengths communicating with each other by virtue of end alignment and proximity, said first length extending toward one of said platforms and communicating with light reflected from one of said vanes;

a second electrical photosensor communicating with said second length of optical fibers; and a differential amplifier fed by the output of the two photosensors so as to provide more freedom from drift than can be obtained using only one photosensor.

11. A multi-channel absolute non-incremental type shaft encoder comprising:

a housing with an associated axis;

a first shaft rotatably mounted along the axis of said housing;

a second shaft rotatably mounted coaxially with said first shaft;

a first sectorlike entirely opaque vane attached to said first shaft;

a second sectorlike entirely opaque vane attached to said second shaft;

a third vane fixed to said housing;

a motor-driven structure which revolves around the axis of said housing and provides mounting platforms confronting said vanes;

a first combination of illumination means and photosensor means on said revolving structure to provide a scanning beam which seeks to penetrate the annular space wherein some shielding is provided by opaque sections of the said first and third vanes;

a second combination of illumination means and photosensor means on said revolving structure to provide a scanning beam which seeks to penetrate the annular space wherein some shielding is provided by opaque sections of the said second and third vanes;

means for passing energy across the rotational interfaces between said housing and the platforms on said structure;

circuit means whereby periods of penetration of scanning beams can be converted to pulse counts and presented as digital measurements of the angular positions of both said shafts relative to said housing; and circuit means for processing scanning-type signals from the illumination-photosensor combinations in order to produce digital measurements of the angular positions of said shafts relative to said housing.

12. An electro-optical encoder comprising:

a housing having an axis, said housing supporting a rotatable protruding shaft on this axis;

a first opaque sector-shaped vane fixed inside said housing;

a second opaque sector-shaped vane fixed to the shaft protruding from said housing, said two vanes being parallel, confronting and in close proximity to each other;

a first scanning platform confronting said second vane near its arc and a second scanning platform confronting said first vane near its arc, a line between two said platforms being in a plane which contains the axis of said housing and being subject to interference with zero, one, or two said vanes depending on the scanning position of said platforms relative to said vanes;

means for revolving said platforms together around the axis of said housing;

a light source;

a first means of energy transfer across a rotational interface in cooperation with said light source so that electrical power can produce a beam of light between the said two platforms;

an electrical photosensor;

a second means of energy transfer across a rotational interface in cooperation with said photosensor so that light coming toward the said second platform from the direction of said first platform causes an electrical output signal to be produced;

circuit means for processing the signals from said second means of energy transfer to provide a digital count which indicates the angular position of the shaft protruding from said housing; and lengths of optical fibers, some fixed inside said housing and some rotating about the axis of said housing, each of said means of energy transfer being an optical transmission means consisting of a first bundle of said optical fibers which are fixed and a second bundle of said optical fibers which are rotating, the two bundles communicating with each other by virtue of end alignment.

13. An electro-optical encoder comprising:

a housing having an axis, said housing supporting a rotatable protruding shaft on this axis;

a first opaque sector-shaped vane fixed inside said housing;

a second opaque sector-shaped vane fixed to the shaft protruding from said housing, said two vanes being parallel, confronting and in close proximity to each other;

a first scanning platform confronting said second vane near its arc and a second scanning platform confronting said first vane near its arc, a line between two said platforms being in a plane which contains the axis of said housing and being subject to interference with zero, one, or two said vanes depending on the scanning position of said platforms relative to said vanes;

means for revolving said platforms together around the axis of said housing;

a light source;

a first means of energy transfer across a rotational interface in cooperation with said light source so that electrical power can produce a beam of light between the said two platforms;

an electrical photosensor;

a second means of energy transfer across a rotational interface in cooperation with said photosensor so that light coming toward the said second platform from the direction of said first platform causes an electrical output signal to be produced;

circuit means for processing the signals from said second means of energy transfer to provide a digital count which indicates the angular position of the shaft protruding from said housing; and a first and a second mirror communicating with said light source and rotating about the axis of said housing, said first mirror being located at the axis of said housing and said second mirror being located on said first platform, said mirrors cooperating as the said first means of energy transfer; and a first and a second length of optical fiber communicating with said photosensor, said fiber lengths having one end located on the axis of said housing, said first length of optical fiber being fixed and having its other end confronting said photosensor, said second length of optical fiber rotating about the axis of said housing and having its other end mounted on said second platform, communication between said lengths of fibers being possible because of end alignment and proximity, said fibers cooperating as the said second means of energy transfer.

14. An electro-optical encoder comprising:

a housing having an axis, said housing supporting a rotatable protruding shaft on this axis;

a first opaque sector-shaped vane fixed inside said housing;

a second opaque sector-shaped vane fixed to the shaft protruding from said housing, said two vanes being parallel, confronting and in close proximity to each other;

a first scanning platform confronting said second vane near its arc and a second scanning platform confronting said first vane near its arc, a line between two said platforms being in a plane which contains the axis of said housing and being subject to interference with zero, one, or two said vanes depending on the scanning position of said platforms relative to said vanes;

means for revolving said platforms together around the axis of said housing;

a light source;

a first means of energy transfer across a rotational interface in cooperating with said light source so that electrical power can produce a beam of light between the said two platforms;

an electrical photosensor;

a second means of energy transfer across a rotational interface in cooperation with said photosensor so that light coming toward the said second platform from the direction of said first platform causes an electrical output signal to be produced;

circuit means for processing the signals from said second means of energy transfer to provide a digital count which indicates the angular position of the shaft protruding from said housing; and a first and a second mirror communicating with said photosensor and rotating about the axis of said housing, said first mirror being located at the axis of said housing and said second platform, said mirrors cooperating as the said second means of energy transfer; and a first and a second length of optical fibers communicating with said light source, said fiber lengths having one end located on the axis of said housing, said first length of optical fiber being fixed and having its other end confronting said light source, said second length of optical fiber rotating about the axis of said housing and having its other end mounted on said first platform, communication between said lengths of fibers being possible because of end alignment and proximity, said fibers cooperating as the said first means of energy transfer.

15. An electro-optical encoder comprising:

a housing having an axis, said housing supporting a rotatable protruding shaft on this axis;

a first opaque sector-shaped vane fixed inside said housing;

a second opaque sector-ahped vane fixed to the shaft protruding from said housing, said two vanes being parallel, confronting and in close proximity to each other;

a first scanning platform confronting said second vane near its arc and a second scanning platform confronting said first vane near its arc, a line between two said platforms being in a plane which contains the axis of said housing and being subject to interference with zero, one, or two said vanes depending on the scanning position of said platforms relative to said vanes;

means for revolving said platforms together around the axis of said housing;

a light source;

a first means of energy transfer across a rotational interface in cooperation with said light source so that electrical power can produce a beam of light between the said two platforms;

an electrical photosensor;

a second means of energy transfer across a rotational interface in cooperation with said photosensor so that light coming toward the said second platform from the direction of said first platform causes an electrical output signal to be produced;

circuit means for processing the signals from said second means of energy transfer to provide a digital count which indicates the angular position of the shaft protruding from said housing; and brushes mounted inside said housing and cooperating with said light source, said source being mounted on said first platform, said brushes and said light source cooperating as the said first means of energy transfer; and two lengths of fiberoptic material, one rotating and one stationary, the two lengths communicating by virtue of end alignment and proximity, the non-rotating length confronting the photosensor and the rotating length having one end mounted on said second platform, said lengths cooperating as the said second means of energy transfer.

16. An electro-optical encoder comprising:

a housing having an axis, said housing supporting a rotatable protruding shaft on this axis;

a first opaque sector-shaped vane inside said housing;

a second opaque sector-shaped vane fixed to the shaft protruding from said housing, said two vanes being parallel, confronting and in close proximity to each other;

a first scanning platform confronting said second vane near its arc and a second scanning platform confronting said first vane near its arc, a line between two said platforms being in a plane which contains the axis of said housing and being subject to interference with zero, one, or two said vanes depending on the scanning position of said platforms relative to said vanes;

means for revolving said platforms together around the axis of said housing;

a light source;

a first means of energy transfer across a rotational interface in cooperation with said light source so that electrical power can produce a beam of light between the said two platforms;

an electrical photosensor;

a second means of energy transfer across a rotational interface in cooperation with said photosensor so that light coming toward the said second platform from the direction of said first platform causes an electrical output signal to be produced;

circuit means for processing the signals from said second means of energy transfer to provide a digital count which indicates the angular position of the shaft protruding from said housing; and brushes mounted inside said housing and cooperating with said photosensor, said photosensor being mounted on said second platform, said second platform, said photosensor and said brushes cooperating as the said second means of energy transfer; and two lengths of fiberoptic material, one rotating and one stationary, the two lengths communicating by virtue of end alignment and proximity, the rotating length having one end mounted on first said platform and the non-rotating length having one end confronting said light source, said lengths cooperating as the said first means of energy transfer.

17. An electro-optical encoder comprising:

a housing having an axis, said housing supporting a rotatable protruding shaft on this axis;

a first opaque sector-shaped vane fixed inside said housing;

a second opaque sector-shaped vane fixed to the shaft protruding from said housing, said two vanes being parallel, confronting and in close proximity to each other;

a first scanning platform confronting said second vane near its arc and a second scanning platform confronting said first vane near its arc, a line between two said platforms being in a plane which contains the axis of said housing and being subject to interference with zero, one, or two said vanes depending on the scanning position of said platforms relative to said vanes;

means for revolving said platforms together around the axis of said housing;

a light source;

a first means of energy transfer across a rotational interface in cooperation with said light source so that electrical power can produce a beam of light between the said two platforms;

an electrical photosensor;

a second means of energy transfer across a rotational interface in cooperation with said photosensor so that light coming toward the said second platform from the direction of said first platform causes an electrical output signal to be produced;

circuit means for processing the signals from said second means of energy transfer to provide a digital count which indicates the angular position of the shaft protruding from said housing; and a reflecting surface on one side of each of said vanes;

a first length and a second length of fiberoptic material, the first rotating and the second stationary, said two lengths communicating with each other by virtue of end alignment and proximity, sand first length extending toward one of said platforms and communicating with light reflected from one of said vanes;

a second electrical photosensor communicating with said second length of optical fibers; and a differential amplifier fed by the output of the two photosensors so as to provide more freedom from drift than can be obtained using only one photosensor.

* * * * *